United States Patent
Perrot

(10) Patent No.: US 10,295,348 B2
(45) Date of Patent: May 21, 2019

(54) METHOD OF ESTIMATING A NAVIGATION STATE CONSTRAINED IN TERMS OF OBSERVABILITY

(71) Applicant: Safran Electronics & Defense, Boulogne-Billancourt (FR)

(72) Inventor: Thierry Perrot, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 37 days.

(21) Appl. No.: 15/522,733

(22) PCT Filed: Oct. 23, 2015

(86) PCT No.: PCT/EP2015/074570
§ 371 (c)(1),
(2) Date: Apr. 27, 2017

(87) PCT Pub. No.: WO2016/066538
PCT Pub. Date: May 6, 2016

(65) Prior Publication Data
US 2017/0314928 A1    Nov. 2, 2017

(30) Foreign Application Priority Data
Oct. 29, 2014 (FR) ..................... 14 60412

(51) Int. Cl.
G01C 21/16 (2006.01)
H03H 21/00 (2006.01)
G06F 17/16 (2006.01)

(52) U.S. Cl.
CPC ........... *G01C 21/16* (2013.01); *G01C 21/165* (2013.01); *G06F 17/16* (2013.01); *H03H 21/003* (2013.01)

(58) Field of Classification Search
CPC .... G01C 21/16; G01C 21/165; H03H 21/003; G06F 17/16
See application file for complete search history.

(56) References Cited

U.S. PATENT DOCUMENTS

| | | | |
|---|---|---|---|
| 2004/0073360 A1* | 4/2004 | Foxlin | G01O 21/16 701/517 |
| 2009/0265104 A1* | 10/2009 | Shroff | G01O 21/165 701/472 |

FOREIGN PATENT DOCUMENTS

WO    WO-2014130854    8/2014

OTHER PUBLICATIONS

Huang, G.P., et al., "Analysis and Improvement of the Consistency of Extended Kalman Filter based SLAM," IEEE International Conference on Robotics and Automation (2008), pp. 473-479.
(Continued)

*Primary Examiner* — Rodney A Butler
(74) *Attorney, Agent, or Firm* — Womble Bond Dickinson (US) LLP

(57) ABSTRACT

There is proposed a method of estimating a navigation state with several variables of a mobile carrier according to the extended Kalman filter method, comprising the steps of:—acquisition of measurements of at least one of the variables,—extended Kalman filtering (400) producing a current estimated state and a covariance matrix delimiting in the space of the navigation state a region of errors, with the help of a previous estimated state, of an observation matrix, of a transition matrix and of the measurements acquired, the method being characterized in that it comprises a step (310, 330) of adjustment of the transition matrix and of the observation matrix before their use in the extended Kalman filtering in such a way that the adjusted matrices satisfy an observability condition which depends on at least one of the variables of the state of the carrier, the observability condi-
(Continued)

tion being adjusted so as to prevent the Kalman filter from reducing the dimension of the region along at least one non-observable axis of the state space, in which the observability condition to be satisfied by the adjusted transition and observation matrices is the nullity of the kernel of an observability matrix associated therewith and in which the adjustment comprises the steps of:—calculation (301) of at least one primary basis of non-observable vectors with the help of the previous estimated state—for each matrix to be adjusted, calculation (306, 308) of at least one matrix deviation associated with the matrix with the help of the primary basis of vectors, shifting (330) of each matrix to be adjusted according to the matrix deviation associated therewith so as to satisfy the observability condition.

8 Claims, 7 Drawing Sheets

(56) References Cited

OTHER PUBLICATIONS

Sagem Defense Securite, "French Preliminary Search Report," FR Application No. 1460412 (Jul. 17, 2015) (with English translation cover sheet).

Sagem Defense Securite, "International Search Report and Written Opinion," PCT Application No. PCT/EP2015/074570 (Feb. 1, 2016) (with English translation cover sheet).

* cited by examiner

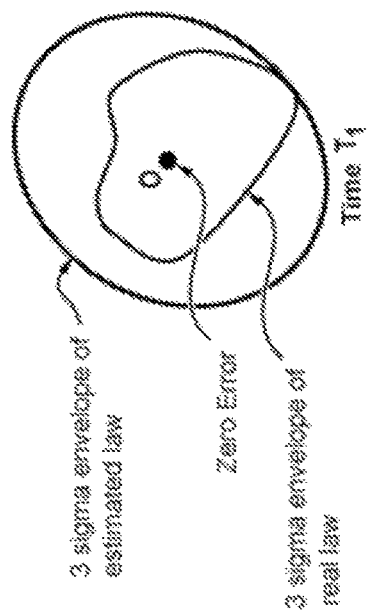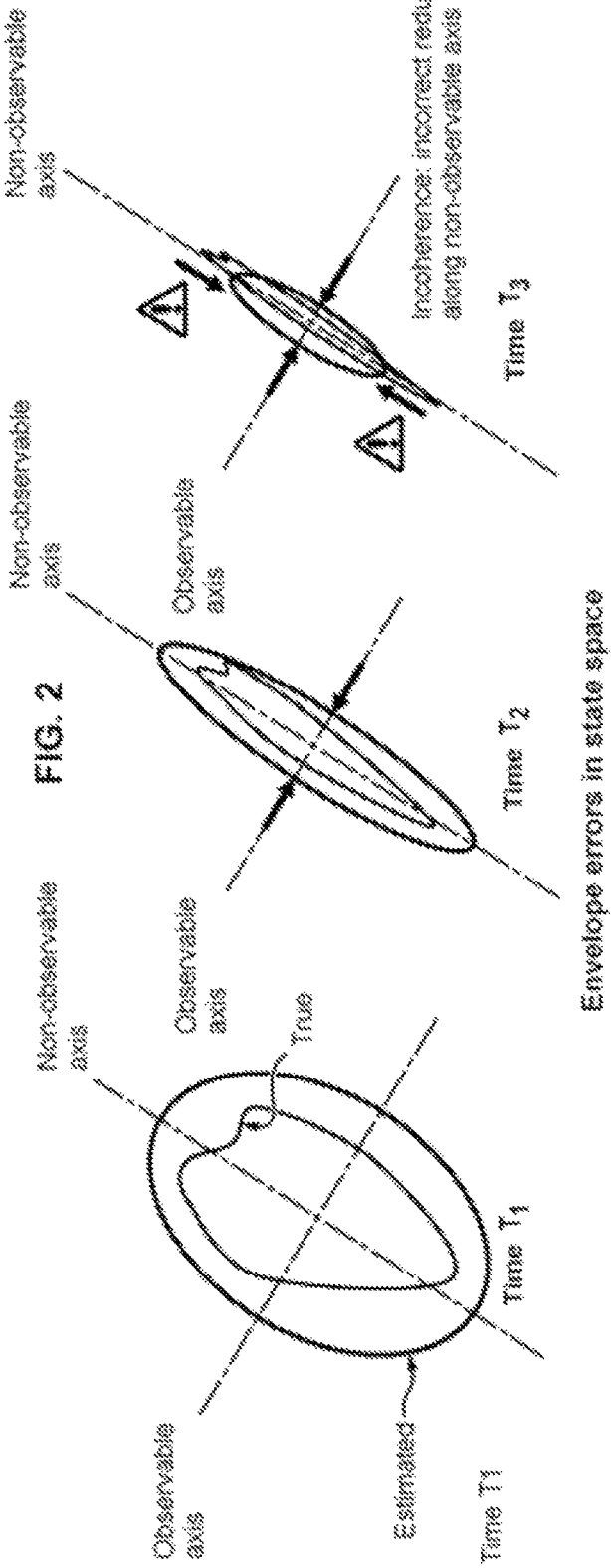
FIG. 1
FIG. 2

FIG. 7

$$\begin{pmatrix} L_1 + \delta L_1 \\ L_2 + \delta L_2 \\ \cdots \\ L_p + \delta L_p \end{pmatrix} (U_1 \ U_2 \ \cdots \ U_q) = \begin{pmatrix} V_{11} & V_{12} & \cdots & V_{1q} \\ V_{21} & V_{22} & \square & V_{2q} \\ \cdots & \cdots & \square & \cdots \\ V_{q1} & V_{q2} & \cdots & V_{qq} \end{pmatrix}$$

$\forall (i,j) \text{ tq } i \neq j, \vec{U}_i \perp \vec{U}_j$ $$\delta \vec{L}_k = \sum_{l=1}^{q} \delta \vec{L}_{kl}$$

$\delta \vec{L}_{kl} = $ Minimal adjustment $\left( \dfrac{\vec{L}_k \cdot \vec{U}_l}{\|\vec{U}_l\|} \right) \dfrac{\vec{U}_l}{\|\vec{U}_l\|}$   $\dfrac{\vec{v}_{kl}}{\|\vec{U}_l\|} \dfrac{\vec{U}_l}{\|\vec{U}_l\|}$ $\vec{v}_{kl} = (\vec{L}_k + \vec{x}_{kl}) \vec{U}_l$

METHOD OF ESTIMATING A NAVIGATION STATE CONSTRAINED IN TERMS OF OBSERVABILITY

GENERAL FIELD

The invention relates to the field of inertial navigation units. The invention relates more particularly to method for estimating a navigation state of a mobile carrier using an extended Kalman filter (generally abbreviated to EKF in the literature), as well as an inertial unit adapted to execute such a method.

PRIOR ART

An inertial navigation unit (INS) is an apparatus designed to provide in real time information on the state of a carrier device: its position, its speed, its orientation, etc. This information can be used to guide the carrier.

A known solution for estimating such a state consists of operating, in an inertial unit, an extended Kalman filter, which provides an estimated state of the carrier by combining data from inertial sensors (accelerometers, gyrometers), and non-inertial sensors adapted to the type of carrier (odometer, baro-altimeter, Doppler radar, GPS receiver, etc). Inertial data play the role of commands, and non-inertial data play that of observations.

The Kalman filter is an algorithm typically comprising a prediction step and an updating step repeated over time: the prediction step calculates a current state from a preceding state and input commands; the updating step refines the current state by means of observations. The prediction calculations are based on a propagation equation modelling the dynamic of the state as a function of the state and of the command. The updating calculations are based on an observation equation, modelling the observation as a function of the state.

In a Kalman filter, the propagation and observation equations are linear and assume the form of matrices not dependent on the estimated state.

In an extended Kalman filter, one at least of these functions is non-linear. The fusion of data is achieved by linearising these functions with the propagation and updating steps. The calculations are therefore made by using matrices, which depend on the estimated state.

The extended Kalman filter can be considered as an algorithm making both non-linear calculations and also linear calculations performed in a Kalman filter inside the extended Kalman filter. The state produced by the non-linear propagation equation will be called "overall state" hereinbelow. The state estimated by the Kalman filter will be called "linearised state". The overall state can be corrected by the information carried by the state linearised during time synchronization steps.

A Kalman filter (extended or not) also calculates a margin of error associated with estimation of the state by considering an estimation of the statistical error due to many factors such as initial errors and noises of inertial sensors used. The statistical error at any given instant can be in the form of a cloud of points in the state space, each point corresponding to a possible realisation. To estimate this margin of error, the unit has a statistical Gaussian model of the error characterised any time by a zero average, and a covariance matrix. The latter defines the envelope of an ellipsoidal volume in the state space, centred on the zero error, and containing 99.97% errors estimated in each direction of the state space. This envelope is called "3 sigma envelope" hereinbelow.

The true statistical law of errors is unknown and characterised by another sigma envelope 3. In general, this envelope is not centred on zero and its form is non-ellipsoidal.

FIG. 1 shows an evolution of an estimated 3 sigma envelope and a true 3 sigma envelope at different iterations of the Kalman filter. The true 3 sigma envelope must be contained in the estimated 3 sigma envelope.

This constitutes a coherence criterion to be respected anytime and for all realisations of random variables of the system.

In general, the Kalman filter improves by means of observations its estimation over time, and the 3 sigma envelopes tend to flatten out along some axes of the state space called "observable", as shown in FIG. 2.

The axes, which are orthogonal to the latter are called "non-observable". The estimated 3 sigma envelope assumes a form that is elongated according to the non-observable axes, which creates correlations between the estimated errors.

Even though the imperfection of the model used by the filter can play a major role, it has been noted that the non-linearities and noises of the system often prevent the coherence criterion described hereinabove to be respected when an extended Kalman filter is used (for example, at time T3 of FIG. 2 the true 3 sigma envelope is no longer localised inside the estimated 3 sigma envelope along a non-observable axis).

In the long term, these incoherences can become substantial and spread to other axes of the vectorial space of the state to be estimated.

These incoherences generally appear only in particular conditions dependent for example on the trajectory of the carrier and initial conditions. These conditions are specific to observation and can be very difficult to foresee. They are all the stronger since the observation is non-linear.

The cause of incoherences is known: the linearisation step, inherent to an extended Kalman filter, is noised by the estimation errors. In fact, this linearisation is performed at the last estimate produced by the filter, an estimate that is, by definition, an imprecise datum. The modifications of the second order produced on the functions linearised by this estimation noise modify the observations and are the cause of incoherences.

In a first case, an observable variable can be considered by the non-observable filter but this case is very unlikely; and in a second case, a non-observable variable can be considered observable by the filter. This reduces the estimated 3 sigma envelope along non-observable axes while it should retain its initial value. Now, this does not reduce the true cloud error along these same axes since the latter are really non-observable. A part of increasing importance of the true error cloud risks no longer being inside the estimated 3 sigma envelope when the latter starts to reduce. The consequences of this incoherence can be considerable and depend on the initial envelope along the non-observable default axes.

A solution of the prior art, which in most cases compensates for the reduction of the estimated 3 sigma envelope consists of applying a model noise. The algorithm EKF in fact comprises an operation consisting of boosting the covariance in prediction phase by means of a matrix of model noises so as to consider those variables and their dynamic, which have not been modelled in the filter. In this coherence problem, the noise matrix is shifted away from its function as the reduction of the estimated envelope is not due to a modelling problem but to an observability problem. Also, for reasons of architecture and digital calculation precision, noises are often applied to the diagonal of the model noise matrix: as for the covariance matrix, the diagonal of this matrix corresponds to the components of the linearised state followed by the filter. As a consequence, the noise is not applied in the direction of the non-observable axes only. The result is that the problem of coherence risks not being fully resolved, and also that this impairs the precision of estimations.

In fact, the applied noise comprises a projection on non-observable axes and a projection on observable axes, these projections able to evolve over time according to the evolution of non-observable axes. The greater the projection according to the observable axes, and the larger the asymptotic value of the error according to these directions, therefore the less precise the estimations.

The value of the noise to be applied as such is not known. An empirical value is selected, generally large so as to consider all known cases posing a problem. This aggravates the problem of the precision.

On the other hand, as the model noise is not applied in the right direction, the estimated envelope elongates according to a direction, which moves away from the true non-observable axis. As a consequence, this ellipsoidal envelope, which definitely becomes larger according to its main axes, risks no longer covering the true error clouds. Therefore, a risk of incoherence remains.

The problem of observability is therefore treated according to the prior art by a solution, which does not fully resolve the problem, and also impairs precision of estimations.

PRESENTATION OF THE INVENTION

The invention aims to estimate the overall state of a mobile carrier governed by a non-linear model by minimising the appearance of incoherences defined in the introduction.

It is therefore proposed a process for estimating a navigation state having several variables of a mobile carrier according to the method of the extended Kalman filter, comprising the steps of:
  acquisition of measurements of at least one of the variables,
  extended Kalman filtering producing a current estimated state and a covariance matrix delimiting in the space of the state of navigation a region of errors, from a preceding estimated state, an observation matrix, a transition matrix and acquired measurements,
the process being characterised in that it comprises an adjustment step (310, 330) of the transition matrix and of the observation matrix prior to their use in the extended Kalman filtering, such that the adjusted matrices verify an observability condition, which depends on at least one of the variables of the state of the carrier, the observability condition being adapted to prevent the Kalman filter from reducing the dimension of the region along at least one non-observable axis of the state space, in which the observability condition to be verified by the adjusted transition and observation matrices is the nullity of the kernel of an observability matrix, which is associated with them, and in which the adjustment comprises the steps of:
  calculation of at least one primary base of non-observable vectors from the preceding estimated state,
  for each matrix to be adjusted, calculation of at least one matrix difference associated with the matrix from the primary base of vectors,
  offsetting of each matrix to be adjusted according to the matrix difference with, which it is associated so as to verify the observability condition.

The process according to the invention improves not only the coherence of estimations but also the precision of estimations, as the part of model noises used according to the prior art for resolving observability problems can be deleted.

Also, this process modifies the software architecture of the EKF filter slightly only, and can be executed in the form of a minimal software update on equipment already in operation. This updating consists of the addition of an adjustment function of 2 matrices, and a reduction in model noise adjustments.

The invention can also be completed by the following characteristics, taken singly or in any of technically possible their combinations. The step of extended Kalman filtering comprises the sub-steps of:
  propagation of the preceding estimated state in a predicted state by means of the adjusted transition matrix,
  linearisation in the predicted state of a non-linear model to produce the observation matrix prior to adjustment,
  adjustment of the observation matrix produced by linearisation.

The fact of performing linearisation after the propagation step ensures that this linearisation is executed at a more probable point of the vectorial space: the predicted state produced by the propagation step. Therefore, adjustment of the observation matrix takes this propagation into consideration, and provides more precise results than in the case where linearisation is performed prior to the propagation step, in the preceding estimated state.

The adjustment can also comprise an orthogonalisation step of the primary base in a secondary base of vectors, the latter being saved from one cycle to the other, and the matrix difference associated with the observation matrix being calculated from the secondary base of vectors.

The matrix difference associated with the observation matrix can be the sum of several independent matrix differences, each matrix difference being calculated from a vector of the secondary base to, which it is specific.

The steps of the process can be repeated in successive cycles. A given cycle, called a current cycle, can comprise steps of:
  storing of the secondary base of vectors and orthogonalisation coefficients, which are also produced by the orthogonalisation step, and
  transformation of the primary base of vectors into a tertiary base of vectors by means of orthogonalisation coefficients stored during a preceding cycle,
  the matrix difference associated with the transition matrix being executed from a secondary base stored during the preceding cycle and of the tertiary base calculated during the current cycle.

The matrix difference associated with the transition matrix can also be the sum of several independent elementary matrix differences, each matrix difference being calculated from a secondary vector of the secondary base stored during the preceding cycle and a tertiary vector of the tertiary base calculated during the current cycle, the secondary and tertiary vectors being specific to the elementary matrix difference.

For at least one matrix to be adjusted, the following can also be calculated:
- a plurality of matrix differences candidates, each matrix difference candidate being calculated from a primary base of respective non-observable vectors, and
- a plurality of metrics, each metric being representative of an amplitude of adjustment caused by a respective matrix difference candidate, the offsetting step of the matrix to be adjusted being executed according to a matrix difference selected from the matrix difference candidates as a function of calculated metrics.

The selected matrix difference can be the matrix difference candidate associated with the metric representative of the smallest amplitude of adjustment.

The offsetting can be executed only if the metric of the selected matrix difference is less than a predetermined threshold.

According to another aspect of the invention an inertial unit is proposed, comprising a plurality of sensors and an estimation module configured for estimating a state of navigation of the inertial unit having several variables by executing the process according to the first aspect of the invention.

DESCRIPTION OF FIGURES

Other characteristics, aims and advantages of the invention will emerge from the following description, which is purely illustrative and non-limiting and must be considered in conjunction with the attached diagrams, in which:

FIGS. 1 and 2, already discussed, illustrate two evolutions of 3 sigma envelopes over time, during deployment of an extended Kalman filter.

FIG. 7 illustrates geometric justification of the adjustment of matrices used by the Kalman filter.

In all figures similar elements bear identical reference numerals.

DETAILED DESCRIPTION OF THE INVENTION

Figure 3:
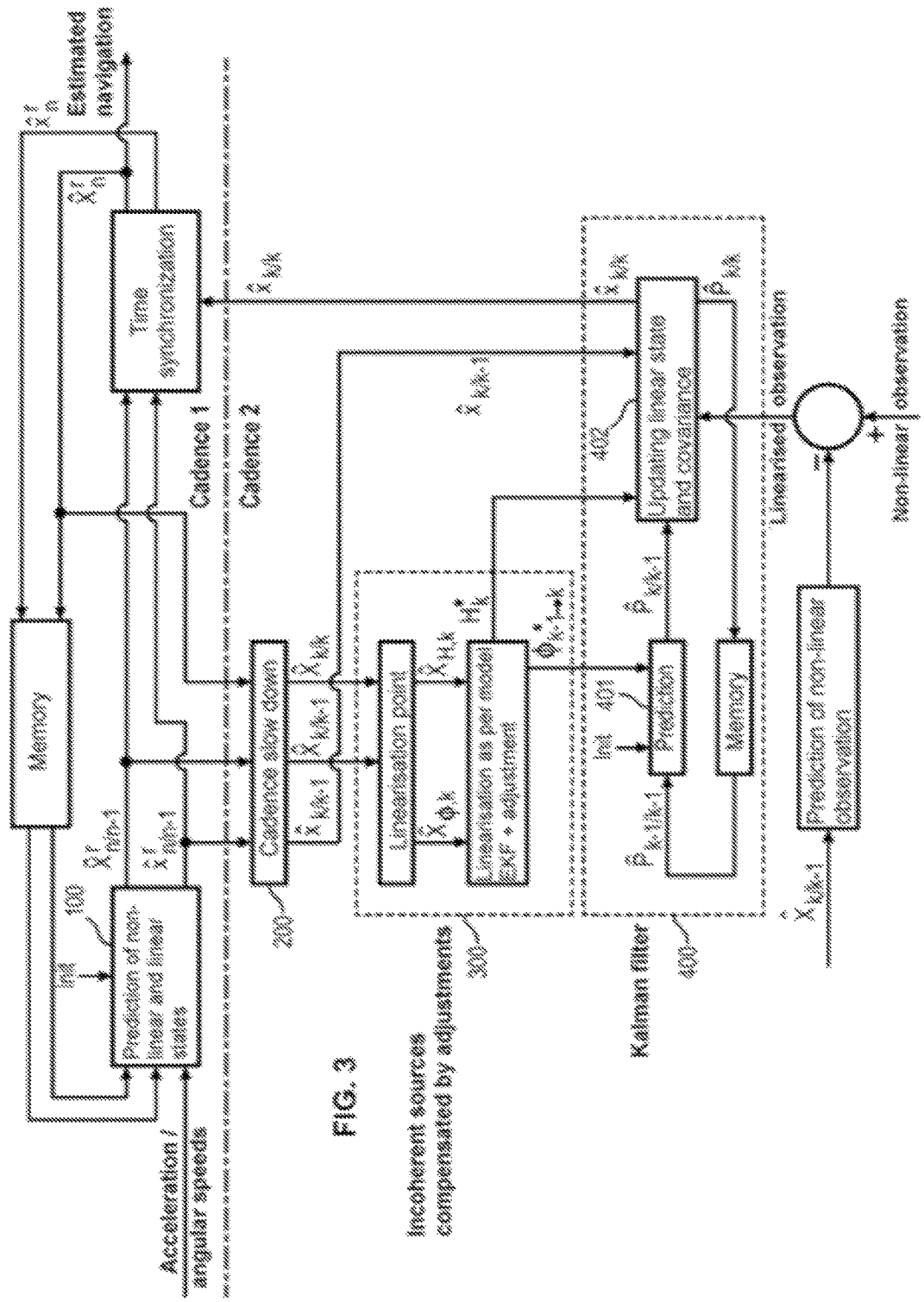
FIG. 3 schematically illustrates a carrier embedding an inertial unit according to an embodiment of the invention.

In reference to FIG. 3, an inertial unit IN is embedded on a mobile carrier device P, such as a land vehicle, a helicopter, an aircraft, etc.

The inertial unit IN comprises several parts: inertial sensors CI, complementary sensors CC, and means E for performing estimation calculations. These parts can be physically separated from each other.

The inertial sensors CI are typically accelerometers and/or gyrometers respectively measuring specific forces and speeds of rotation undergone by the carrier relative to an inertial referential. The specific force corresponds to the acceleration of non-gravitational origin. When these sensors are fixed relative to the carrier, the unit is called a "strap down" type.

The additional sensors CC are variable according to the type of carrier, its dynamic, and the specific application. The inertial units typically use a receiver GNSS (GPS for example). For a land vehicle this can also be one or more odometers. For a boat it can be a "loch", giving the speed of the boat relative to that of the water or of the seabed. The cameras form another example of sensors.

The navigation estimation means E will be designated hereinbelow under the term "estimator". The means E typically comprises one or more processors.

The output data of the estimator E are a state of navigation of the carrier and optionally of internal states of the inertial unit.

The estimator E comprises especially an extended Kalman filter EKF configured to combine the information data by the complementary sensors and the inertial sensors so as to provide optimal estimation of navigation information.

The merging is done as per a continuous dynamic system serving as model to predict the state any time by means of a function of non-linear propagation f, and the way of the observer by means of an observation function h, which can be non-linear (for this see annex 5 emphasising a few principles on dynamic systems), this function dependent on the type of sensor CC used:

$$\begin{cases} \dot{X}(t) = f(X(t), u(t)) \\ z(t) = h(X(t)) \end{cases}$$

wherein $\mu(t)$ illustrates an input command constituted by the specific force and angular speed. These 2 magnitudes are measured by the sensors CI discretely over time according to a period $T_1$.

The overall state $X(t)$ comprises inter alia coordinates of position, speed, and the orientation of the carrier in the form of one or more rotations, each of them represented for example by a matrix or an attitude quaternion. The estimator E exploits a discrete version of these equations at continuous time obtained according to the rules of the prior art:

$$\begin{cases} X_k = g(X_{k-1}, u_{k-1}) \\ z_k = h(X_k) \end{cases}$$

The EKF filter functions iteratively according to a prediction step taking into account the measurements of sensors CI and an updating step taking into account the measurements of sensors CC:

The prediction step comprises predicting an overall estimated state, and predicting an associated covariance.

Prediction of estimated overall state: $\hat{X}_{k|k-1} = g(\hat{X}_{k-1|k-1}, \mu_{k-1})$ Prediction of associated covariance: $\hat{P}_{k|k-1} = \phi_{k-1 \to k} \hat{P}_{k-1|k-1} \phi_k^{T-1 \to k} + Q_{k-1}$ where $\phi_{k-1 \to k}$ corresponds to the transition matrix dependent on the propagation function f, and Q the matrix of model noises.

The updating step utilises the following variables:
Innovation: $\tilde{y}_k = z_k - h(\hat{X}_{k|k-1})$
Covariance innovation: $S_k = H_k \hat{P}_{k-1|k-1} H_k^T + R_k$
where $H_k$ corresponds to the observation matrix.
Kalman gain: $K_k = \hat{P}_{k-1|k-1} H_k^T S_k^{-1}$
Updating is performed as follows:
Estimated overall state updating: $\hat{X}_{k|k} = \hat{X}_{k|k-1} + K_k \tilde{y}_k$
Associated covariance updating: $\hat{P}_{k|k} = (I - K_k H_k) \hat{P}_{k|k-1}$ Theoretical transition matrix $$\phi_{k-1 \to k} = \int_{(k-1)T}^{kT} \exp(F(\tau))d\tau$$

$$\text{With: } F(t) = \left.\frac{\partial f}{\partial X}\right|_{X(t),u(t)}$$

$$\text{Observation matrix } H_k = \left.\frac{\partial h}{\partial X}\right|_{\hat{x}_{k|k-1}}$$

Although it is close to this algorithm the estimator E is different to it. Updating of the overall state cannot be done fully additively, especially for retaining the properties of rotation matrices, and especially also for considering the rapid cadence of measurements of sensors CI. Prediction of the estimated overall state can be done at a faster cadence than that of other operations. The difference in cadence can depend on the dynamic of the carrier. Other differences are possible. For example, an approximation can be made on the transition matrix.

Figure 4:
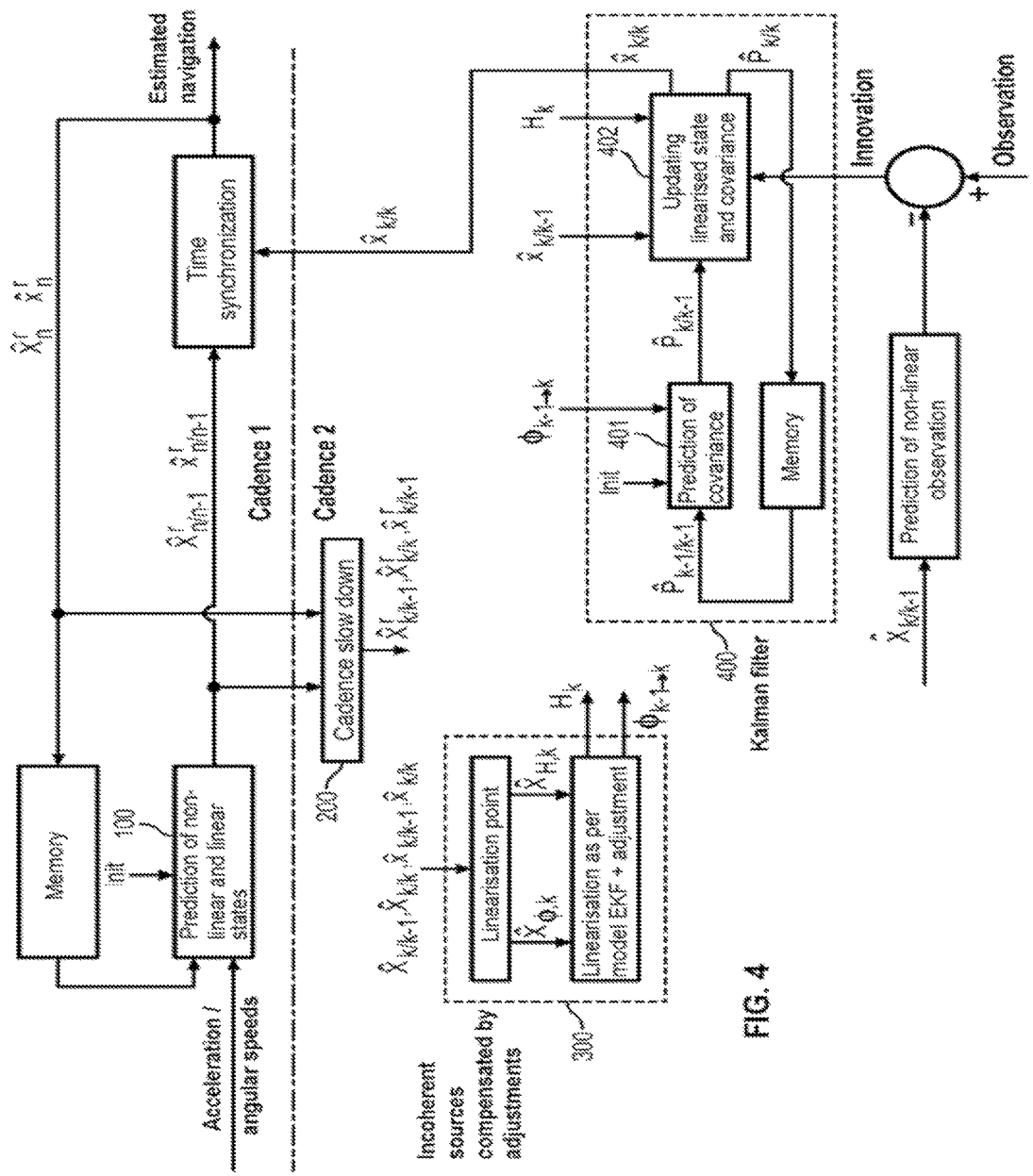
FIG. 4 is the functional diagram of an estimator according to an embodiment.

FIG. 4 shows an estimator E according to an embodiment comprising different functional blocks corresponding to respective steps of its execution.

Estimation is performed in successive iterations, each iteration being identified by an index k.

Predicting the estimated overall state according to a cadence 1 is done in step 100. A memory on 1 cycle, and a time synchronization step function at the same cadence. This time synchronization step considers data updated at a slower cadence 2.

All other processing operates at cadence 2. Step 200 converts states of cadence 1 into states of cadence 2. At cadence 2, $\hat{X}_{k/k-1}$, $\hat{x}_{k/k-1}$, $\hat{X}_{k/k}$, $\hat{x}_{k/k}$, this last state coming from the last update of the Kalman filter 400, represents in order the predicted overall state, the predicted linearised state, the overall updated state, the updated linearised state. The state $\hat{x}_{k/k-1}$ can in some cases still be 0.

The transition and observation matrices are calculated in the linearisation step 300. A sub-adjustment step, specific to the invention and detailed later, is added to this step 300.

The innovation is calculated as per the predicted overall state and as per observation of sensors CC shown below in FIG. 4.

The other steps of the EKF are combined into step 400, which performs estimations by means of matrices, and constituting a Kalman filter, these estimations referring to linearised states and covariances. A particular feature originates from the fact that step 400 contains no prediction of linearised state, which can optionally be incorporated into step 100 at cadence 1.

Step 401 comprises predicting the covariance associated with the predicted overall state and exploits the transition matrix. Step 402 comprises calculation of the covariance of the innovation, Kalman gains, updating of the covariance of the overall state, and updating of the linearised state. This step exploits the observation matrix.

The linearisation points in step 300 can be calculated as a function of $\hat{X}_{k/k-1}$, $\hat{x}_{k/k-1}$, $\hat{X}_{k/k}$, $\hat{x}_{k/k}$, this latter state originating from the last update of the Kalman filter 400. If $\hat{x}_{k/k-1}=\hat{x}_{k/k}=0$ then $\hat{X}_{\phi,k-1}=\hat{X}_{k-1/k-1}$ and it $\hat{X}_{H,k}=\hat{X}_{k/k-1}$.

In step 300 a first linearisation point $\hat{X}_{\phi,k-1}$ allows to calculate the transition matrix $\phi_{k-1\to k}(\hat{X}_{\phi,k-1})$ at the Kalman period corresponding to the cadence 2. This linearisation point corresponds to the overall state estimated after the last time synchronization.

A second linearisation point $\hat{X}_{H,k}$ allows to calculate the observation matrix $H_k(\hat{X}_{H,k})$ at the Kalman cycle k in step 300. This linearisation point is obtained as per the calculations of step 100. It corresponds to the last state predicted prior to the next time synchronization.

To simplify notations, the transition matrix $\phi_{k-1\to k}(\hat{X}_{\phi,k-1})$ will be noted from now on as $\phi_{k-1\to k}$, and the observation matrix $H_k(\hat{X}_{H,k})$ noted from now on as $H_k$. $\phi_{k-1\to k}$ and $H_k$ are therefore each expressed as a function of an overall state corresponding to their respective linearisation points $\hat{X}_{\phi,k-1}$ and $\hat{X}_{H,k}$.

As said previously, the steps are repeated recursively at the following iteration of instant k+1 at the cadence 2, a cadence of the Kalman filter.

Adjustment of Transition and Observation Matrices

The linearisation step taken in each Kalman cycle constitutes a weak point of the estimator E.

Therefore the estimation process comprises in step 300 an additional adjustment step as a function of an observability condition, adjusting the matrices generated by this linearisation step before their use by the Kalman filter: on the one hand the transition matrix (which is used to propagate the covariance matrix), and on the other hand the observation matrix.

The observability condition consists of constraint imposed on the kernel of the observability matrix (the definition of this matrix is indicated in annex 6) via adjustment of the transition and observation matrices so as to include a model predetermined of sub-vectorial non-observable space in the kernel. This model of non-observability consists of an equation in the state space of a sub-vectorial space represented by a base, as a function of an overall state, wherein this sub-vectorial space is updated at each Kalman cycle. The fact of including this sub-space in the kernel of the observability matrix makes it non-observable and diminishes the risk of incoherence if the model is pertinent.

The overall state from which the sub-vectorial space made non-observable is calculated corresponds to the linearisation point of the observation function (see annex 6). A non-observable vector in fact has a zero image via the observation matrix, and this vector corresponds to a linearised state close to an overall state corresponding to the linearisation point of the observation function.

During the adjustment step, a corresponding matrix difference is calculated for each of the two transition and observation matrices.

By convention, starred notations will be used hereinbelow to designate the transition and observation matrices output by the adjustment step.

Figure 8:
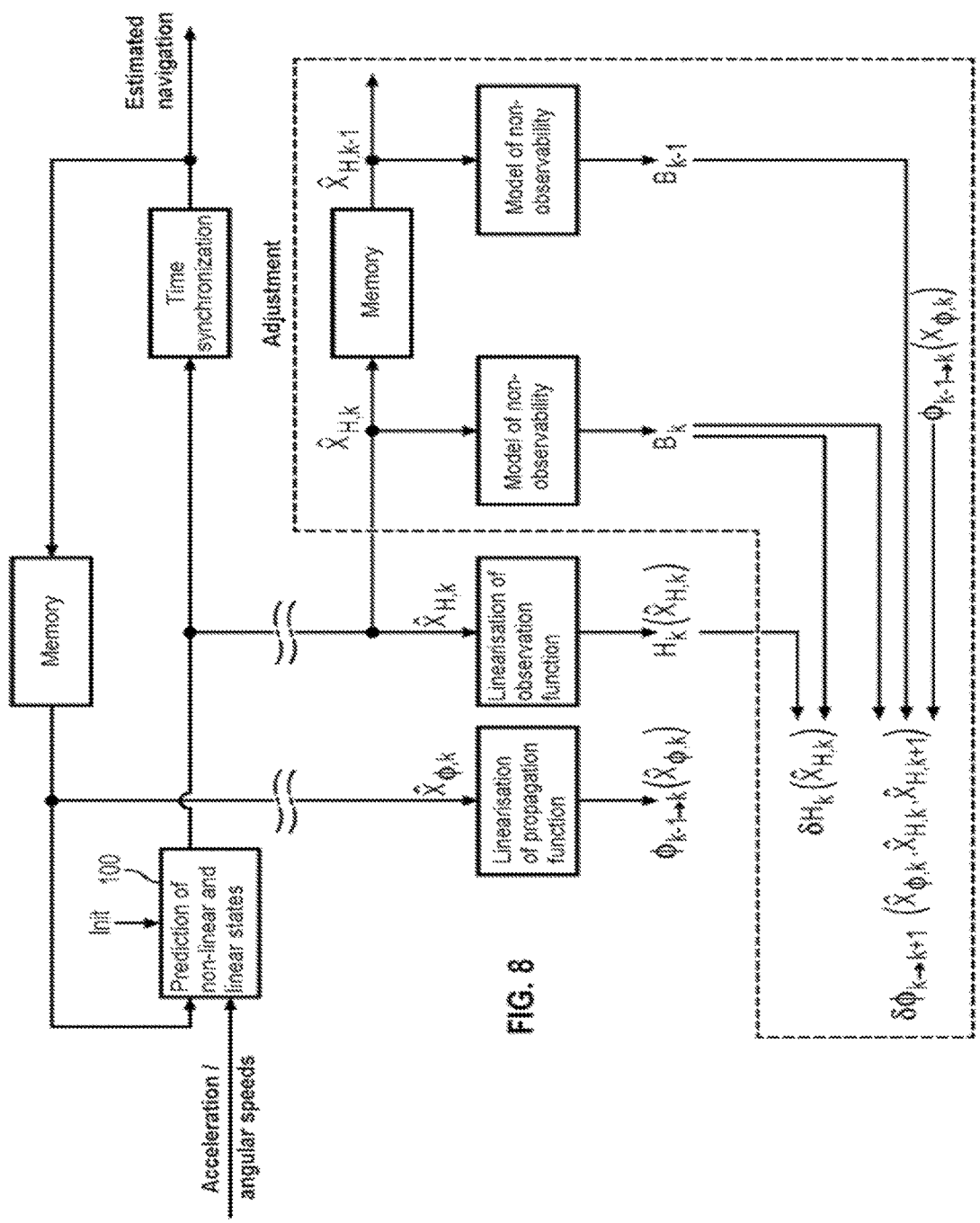
FIG. 8 illustrates a data flow corresponding to performing the steps illustrated in FIG. 3.

The data flow for adjustment calculation is shown schematically in FIG. 8, revealing the fact that adjustment of the observation matrix depends on the linearisation point of the observation function in the current Kalman cycle, and that adjustment of the transition matrix depends on the linearisation point of the observation function in the current cycle and in the preceding cycle.

It is therefore necessary to exploit a base $B_k$ generating the sub-vectorial non-observable space at cycle k, and a base $B_{k-1}$ generating the sub-vectorial space non-observable at cycle k−1.

Figure 5:
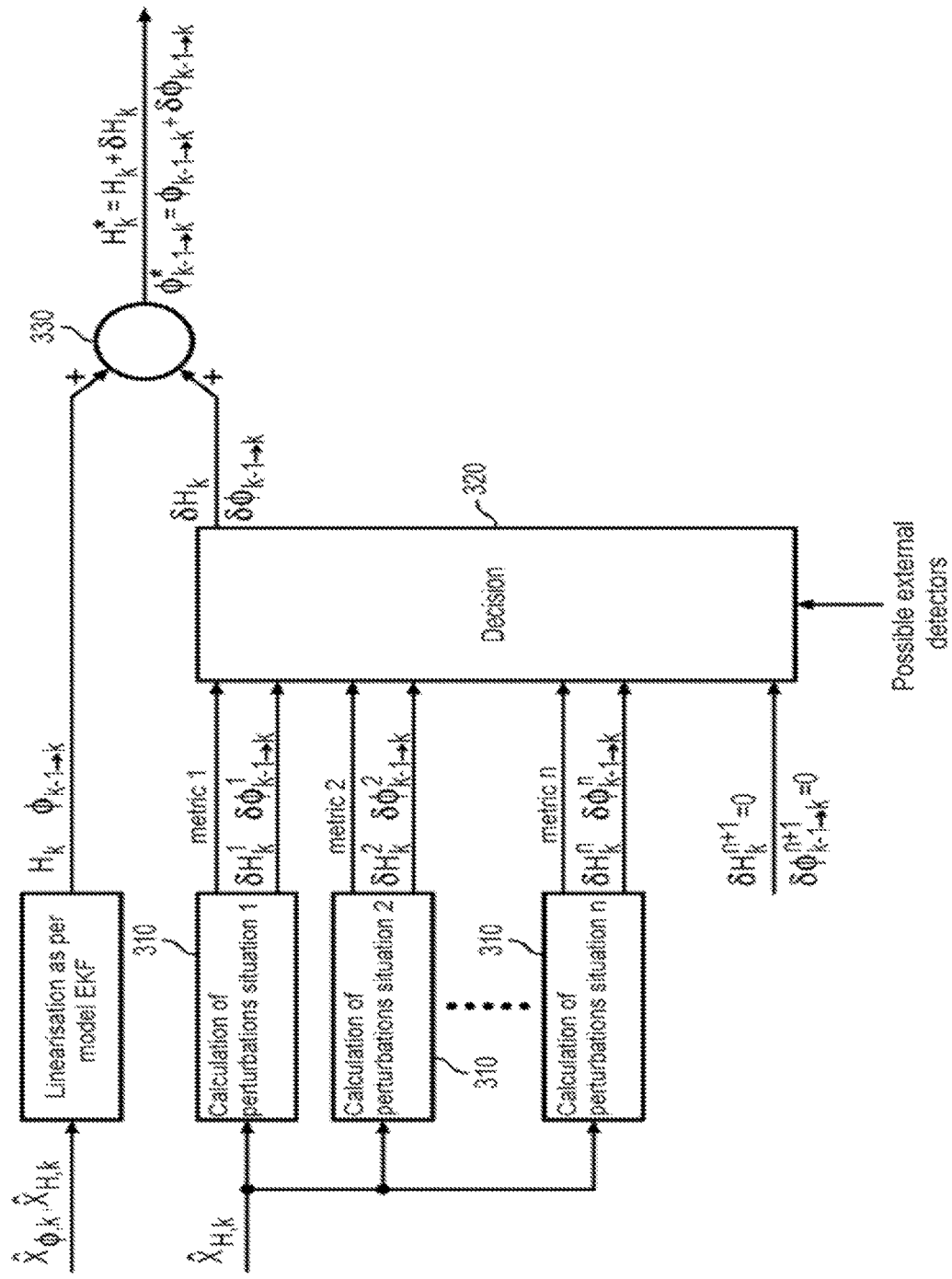
FIG. 5 is the functional diagram of a linearisation and adjustment block included in the estimator of FIG. 2.

On a Kalman cycle it is possible to store the linearisation point and generate the non-observable base twice per cycle, as shown in figure X. It is equally possible on a Kalman cycle to store the non-observable base so as to generate it once per cycle only. This second option corresponds to the principle diagram of FIG. 6. The latter details the adjustment functions described in FIG. 5.

Figure 6:
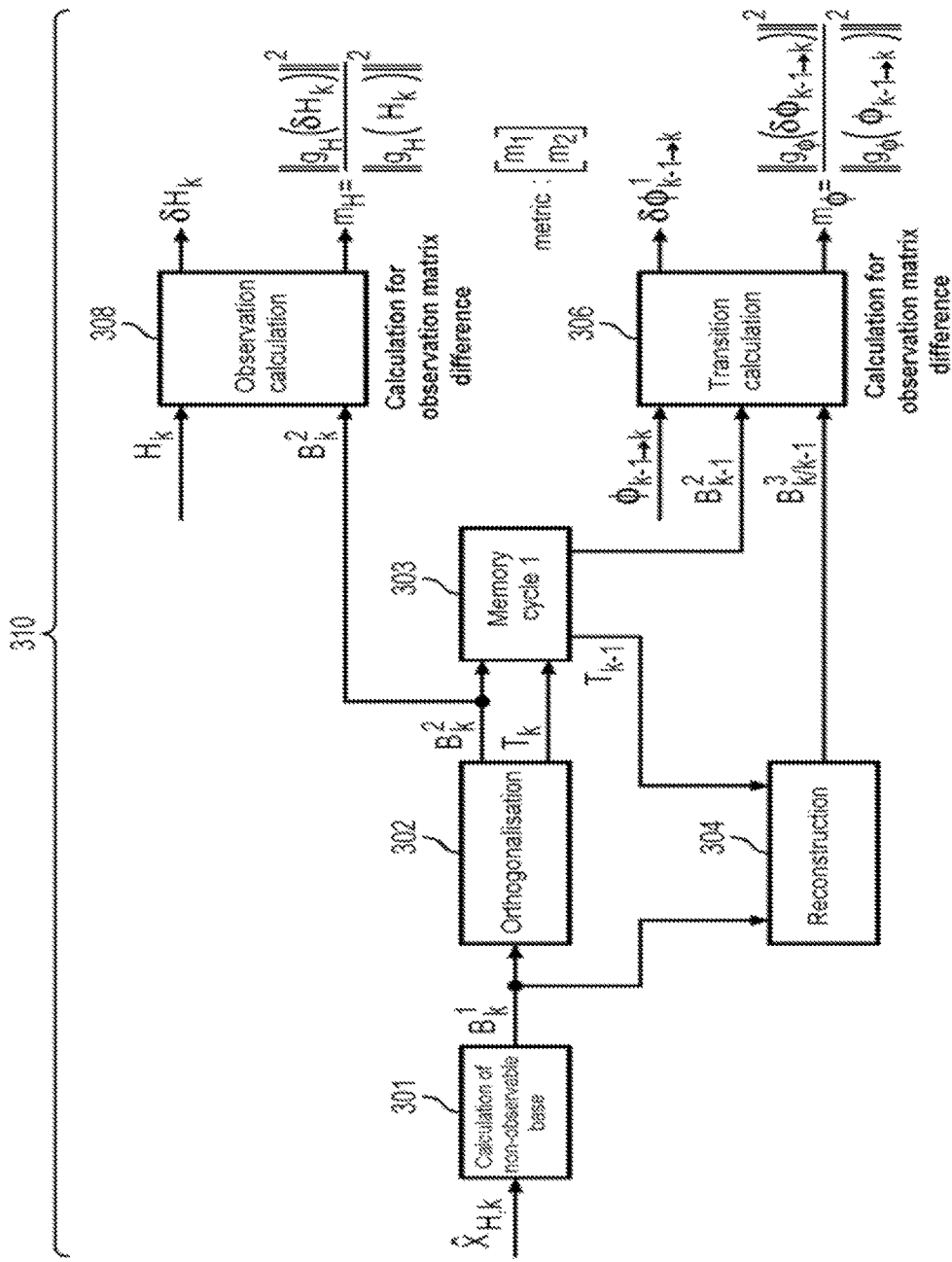
FIG. 6 is the functional diagram of a sub-block shown in FIG. 5.

FIG. 6 details the calculations resulting in obtaining the two matrix differences relative to the transition and observation matrices at the Kalman cycle of instant k.

The transition matrix of the Kalman cycle k−1 at the cycle k and the observation matrix at the cycle k are adjusted as per a model of non-observability using the overall state vectors $\hat{X}_{H,k-1}$ and $\hat{X}_{H,k}$ linearisation points of the observation function at cycles k−1 and k. In a step 301, this model estimates the non-observable space of linearised states in the form of a primary non-observable base $B_k^1$. Such a base can be calculated at each Kalman cycle by using a function analytical obtained during designing of the filter as per the method presented in annex 6 by means of a dynamic system having continuous time, then applied to the dynamic system having discrete time used by the navigation unit.

Two examples of situations at risk, which can be treated according to the process of the invention are described in annex 1. A model of non-observable base specific to the static alignment is developed in annex 2.

Simplifying assumptions are necessarily made to work out this model during the design phase as no equation containing a limited number of variables can represent the real world. It is possible that the true error cloud reduces slowly in all directions of the state space but that due to non-linearities and estimation noises, the EKF estimates a faster decrease along some axes, which crates incoherence. It is possible to model the slow decrease along a certain axis by zero decrease over time and consider this non-observable axis so as to impose a restriction on it. This simplification slightly reduces precision but guarantees coherence of estimations. But as it is no longer necessary to employ model noises to prevent the estimated 3 sigma envelope from reducing along the non-observable axes, a precision gain is a final result.

The static alignment described in annex 1 is an example of a situation in which the model does not consider minimal imperceptible movements, which in the short term have no effect, but, which can be observed in the long term, causing a slow decrease of the true 3 sigma envelope along some axes. In the interests of simplification of the model it is proposed not to consider and model a non-observable base by considering that these small movements are zero, which is an example of simplification. In the second example of annex 1 the soft movement can also be overlooked for modelling the non-observable base.

If the base $B_k^1$ is orthogonal there is a solution described in annex 3 for adjusting the matrices simply. But this condition is generally unsatisfactory. The proposed solution consists of orthogonalising the base, then making the adjustment. The processing events described below are justified by the final paragraph of annex 3 dealing with the non-orthogonal base.

In an orthogonalisation step 302, the primary base $B_k^1$ is orthogonalised so as to obtain a secondary base $B_k^2$ according to a variant of the Gramm-Schmidt method, wherein the vectors are not made unitary since standardisation is included implicitly in the adjustment formula of the matrices presented hereinbelow. This operation generates a matrix $$T_k = [a_{i,j,k}]_{\substack{1 \leq i \leq q \\ 1 \leq j \leq q}}$$

of coefficients having served orthogonalisation.

Let q be the number of vectors of the primary non-observable base.

$B_k^1 = [\hat{v}_{1,1,k} \; \hat{v}_{1,2,k} \; \ldots \; \hat{v}_{1,q,k}]$, and
$B_k^2 = [\hat{v}_{2,1,k} \; \hat{v}_{2,2,k} \; \ldots \; \hat{v}_{2,q,k}]$ are put forward.

In the cycle k, the orthogonalisation step can make the following calculation:

$$\hat{v}_{2,1,k} = \hat{v}_{1,1,k}, \; T_k = [0]_{\substack{1 \leq i \leq q \\ 1 \leq j \leq q}}$$

$$\text{Then: } \forall\, i \geq 2,\, i \leq q: \; \hat{v}_{2,i,k} = \hat{v}_{1,i,k} - \sum_{j=1}^{i-1} a_{i,j,k} \hat{v}_{2,j,k}$$

$$\text{With } a_{i,j,k} = \begin{cases} \dfrac{(\hat{v}_{2,j,k}^T \hat{v}_{1,i,k})}{(\hat{v}_{2,j,k}^T \hat{v}_{2,j,k})} & \text{if } 2 \leq i \leq q \\ & \text{and } 1 \leq j < i \\ 0 & \text{if not} \end{cases} : \text{coefficients grouped in } T_k$$

This base $B_k^2$ and the orthogonalisation coefficients $T_k$ are stored in step 303 during a Kalman cycle.

In a step 308 the base $B_k^2$ calculates a matrix difference $\delta H_k$ relative to the observation matrix $H_k$, without inversion of any matrix, which allows to reduce the calculation load. This step can be omitted if the observation matrix is independent of the estimated state. In this case, the matrix difference is zero.

It is possible to decompose the matrix difference $\delta H_k$ relative to the observation matrix $H_k$ into q elementary matrix differences:

$$\delta H_k = \sum_{i=1}^{q} \delta H_{i,k}$$

This decomposition parallelises the calculation of each elementary matrix difference and shortens the calculation time of step 308.

According to annex 3, each elementary matrix difference can be calculated as follows: For i between 1 and q, $$\delta H_{i,k} = -\frac{1}{\hat{v}_{2,i,k}^T \hat{v}_{2,i,k}} (H_k \hat{v}_{2,i,k}) \hat{v}_{2,i,k}^T$$

Also, in the cycle k, the base $B_k^1$ and the coefficients $T_{k-1}$ (stored in the preceding Kalman cycle k−1) reconstruct a non-observable base $B_{k/k-1}^3$ in a reconstruction step referenced 304. This base reconstructed at the instant k depends on the primary base at the instant k, but also the orthogonalisation coefficients at the instant k−1. Its index is therefore noted k/k−1 corresponding to the instant k, knowing the estimations at the instant k−1. The bases $B_{k-1}^2$ and $B_{k/k-1}^3$ calculate the matrix difference $\delta\phi_{k-1 \to k}$ without inversion of matrix.

$B_{k/k-1}^3 = [\hat{v}_{3,1,k/k-1} \; \hat{v}_{3,2,k/k-1} \; \ldots \; \hat{v}_{3,q,k/k-1}]$ is put forward.

In the cycle k, reconstruction step 304 can make the following calculation:

Coefficients $a_{j,k-1}$ extracted from $T_{k-1} = [a_{i,j,k-1}]_{\substack{1 \leq i \leq q \\ 1 \leq j \leq q}}$ $\hat{v}_{3,1,k/k-1} \hat{v}_{1,1,k}$ -continued Then:

$$\forall\, i \geq 2,\, i \leq q: \hat{v}_{3,i,k/k-1} = \hat{v}_{1,i,k} - \sum_{j=1}^{i-1} a_{i,j,k-1} \hat{v}_{3,j,k/k-1}$$

In a step referenced 306, a matrix difference relative to the transition matrix is calculated.

It is possible to decompose the matrix difference $\delta\phi_{i,k-1\to k}$ relative to the transition matrix $\phi_{i,k-1\to k}$ into q elementary matrix differences:

$$\delta\phi_{k-1\to k} = \sum_{i=1}^{q} \delta\phi_{i,k-1\to k}$$

According to annex 3, each elementary matrix difference can be calculated as follows:

For i between 1 and q, $$\delta\phi_{i,k-1\to k} = \frac{1}{\hat{v}_{2,i,k-1}^T \hat{v}_{2,i,k-1}} (\hat{v}_{3,i,k/k-1} - \phi_{k-1\to k}\hat{v}_{2,i,k-1}) \hat{v}_{2,i,k-1}^T$$

This decomposition parallelises the calculation of each elementary matrix difference and can shorten the calculation time of step 306.

To reduce the memory usage and calculations, just a single sub-matrix of the transition matrix can be considered: the one in correspondence with the non-zero values of the non-observable vectors.

The two resulting matrix differences verify an important observability condition, a condition detailed in annex 7.

Also, annex 3 explains the origin of the calculation method, and annex 8 gives a mathematical demonstration of it.

Calculation step 306 also produces a metric representative of an amplitude of adjustment caused by the matrix difference relative to the transition matrix.

The calculation step 308 also produces a metric representative of an amplitude of adjustment caused by the matrix difference relative to the observation matrix.

The same type of metric calculation can be performed for the transition matrix and the observation matrix. For example, for the transition matrix the square of the norm of the matrix difference and that of the transition matrix are calculated separately. The metric corresponds to the ratio of these two magnitudes, or the square root of the ratio of these two magnitudes.

The norm optionally uses weighting coefficients to standardise the magnitudes occurring in the state vector. For example, a position error can be of the order of a few meters, whereas an attitude error can be of the order of a few milli-radians. A matrix norm can correspond to the norm of a vector formed by putting all the terms of the matrix in the form of a vector column (Froebenius norm).

Annex 4 explains how to exploit weighting coefficients in the calculation of metrics.

The calculation of metrics optionally employs weighting functions $g_{100}(\ )$ and $g_{H(\ )}$. If the observation matrix $H_k$ is independent of the estimated state, the matrix difference $\delta H_k$ is zero, and its metric is zero. It is not useful to calculate it. Identically, if the transition matrix is independent of the estimated state, calculation of the associated metric can be omitted.

Referring again to FIG. 5, in an offsetting step 330, the transition matrix and the associated matrix difference are summed so as to obtain an adjusted transition matrix; besides, the observation matrix and the associated matrix difference are summed so as to obtain an adjusted observation matrix.

The sequence 310 illustrated in FIG. 6 producing a pair of matrix differences and a pair of metrics can be conducted n times in parallel.

It is assumed that for n predetermined situations in the continuous field a non-observable base model is known. This model comes from the resolution of a system of equations representative of a type of respective observation and optionally a respective trajectory of the state vector, whereof a method is given in Annex 6.

In a decision step 320, one of the n pairs of matrix differences is selected (for example the pair obtained by the adjustment corresponding to the situation i), and the offsetting step is carried out only with this pair of matrices to produce the adjusted matrices.

The decision step 320 runs a probability test on each pair of matrix differences, by inspecting the value of the corresponding metrics. This test takes the decision to recognise such and such situation.

The selected matrix difference is the matrix difference candidate associated with the metric representative of the smallest adjustment amplitude. So adjustment is made with the most "probable" matrix differences. The probability criterion can refer to adjustment of the transition matrix and/or of the observation matrix.

Also, the offsetting is carried out only if the metric of the matrix difference selected is less than a predetermined threshold: it can in fact be preferable not to operate offsetting of transition and observation matrices if this offsetting is not considered reliable enough and introduces extra noise to the system rather than correcting it.

The foregoing estimation process can be performed by a computer program executed by the calculation means of the inertial unit IN. Also, the identification card 1 comprises a computer program product comprising program code instructions for execution of the steps of the process described when this program is executed by the identification card 1.

Annex 1: Examples of Situations at Risk of an Inertial Navigation Unit Exploiting an EKF Filter A first example relates to an inertial navigation unit in static alignment phase on the ground. In this phase, the local vertical is estimated by measuring the gravity vector by means of accelerometers, and the orientation of the unit is estimated by measuring the angular speed vector of terrestrial rotation by means of gyrometers. The observation used in this phase is typically ZUPT (Zero velocity Update), which is an observation of a virtual sensor indicating that the speed of the carrier is zero relative to the earth. A measurement error is modelled by white noise. Now, it eventuates that the inertial sensors record small non-random movements due for example to wind or effects of dilation due to heat. This corresponds to a determinist measuring error not taken into account in the non-inertial sensor model producing the observation ZUPT.

There is incoherence between the dynamic true system and the dynamic modelled system. Because the duration of the static alignment is short, incoherence is negligible. By contrast there are many applications needing a alignment of several hours, or several days, weeks or months. In this case, it is possible for the incoherence to become preponderant.

A second example relates to an inertial navigation unit mounted on a sailing boat exploiting speed observation by projection in the marker boat. This non-inertial measurement is taken in general by means of a "Loch" sensor and it can also be a relative measurement relative to the water. The fact that it is done in projection in the marker boat creates dependence on measuring vis-à-vis the attitude of the boat. Assuming that this observation alone is used, it is possible for incoherence to appear between the estimations of the EKF filter and the real world, and for this incoherence to produce substantial errors after several hours if the boat is sailing at a constant heading.

Annex 2: Model of Non-Observable Axes in Static Alignment

This annex presents the modelling of the non-observable base resolving the incoherence of the first example of the annex 1 by means of the proposed process.

Hypotheses: The Kalman filter exploits the model of errors in PHI and the mechanisation functions in free azimuth.

The following notations are used:

| | |
|---|---|
| [t] | Terrestrial frame. x = axis of rotation |
| [m] | Measurement frame |
| [v] | Platform frame, in free azimuth |
| $T_{vt}$ | Change of basis matrix from [t] to [v] |
| $T_{vm}$ | Change of basis matrix from [m] to [v] |
| α | Mechanisation angle |
| $\Omega_t$ | Terrestrial rotation speed |
| g | Gravity module (gravity = heaviness ≠ gravitation) |
| $g_e$ | Gravity module at the equator |
| $\alpha_0, K_1, K_2$ | Constants linked to geodesic constants WGS84 |
| $R_x$ | Radius of curvature of the reference ellipsoid in the direction x of [v] |
| $R_y$ | Radius of curvature of the reference ellipsoid in the direction y of [v] |
| $R_N$ | Radius of curvature of the reference ellipsoid in the north direction |
| $R_E$ | Radius of curvature of the reference ellipsoid in the east direction |
| τ | Geodesic torsion on the reference ellipsoid |
| L | Latitude |
| z | Altitude |

| | |
|---|---|
| Δx | Position error according to the axis x of [v] |
| Δy | Position error according to the axis y of [v] |
| Δz | Position error according to the axis z of [v] |
| $\Delta V_x$ | Speed error according to the axis x of [v] |
| $\Delta V_y$ | Speed error according to the axis y of [v] |
| $\Delta V_z$ | Speed error according to the axis z of [v] |
| $\phi_x$ | Rotation error according to the axis x of [v] |
| $\phi_y$ | Rotation error according to the axis y of [v] |
| $\phi_z$ | Rotation error according to the axis z of [v] |
| $\Delta b_{xm}$ | Accelerometer bias error according to the axis x of [m] |
| $\Delta b_{ym}$ | Accelerometer bias error according to the axis y of [m] |
| $\Delta b_{zm}$ | Accelerometer bias error according to the axis z of [m] |
| $\Delta K_{xm}$ | Accelerometer scale factor error according to the axis x of [m] |
| $\Delta K_{ym}$ | Accelerometer scale factor error according to the axis y of [m] |
| $\Delta K_{zm}$ | Accelerometer scale factor error according to the axis z of [m] |
| $\Delta d_{xm}$ | Gyro deviation error according to the axis x of [m] |
| $\Delta d_{ym}$ | Gyro deviation error according to the axis y of [m] |
| $\Delta d_{zm}$ | Gyro deviation error according to the axis z of [m] |

The components of states occurring in the equations are presented in an arbitrary order, which is the following:

$$N = \begin{bmatrix} \begin{bmatrix} \Delta x \\ \Delta y \\ \Delta z \end{bmatrix} \\ \begin{bmatrix} \phi_x \\ \phi_y \\ \phi_z \end{bmatrix} \\ \begin{bmatrix} \Delta b_{xm} \\ \Delta b_{ym} \\ \Delta b_{zm} \end{bmatrix} \\ \begin{bmatrix} \Delta K_{xm} \\ \Delta K_{ym} \\ \Delta K_{zm} \end{bmatrix} \\ \begin{bmatrix} \Delta d_{xm} \\ \Delta d_{ym} \\ \Delta d_{zm} \end{bmatrix} \\ \Delta\alpha \\ \text{Other zero components} \end{bmatrix}$$

| | |
|---|---|
| $\begin{bmatrix} \Delta x \\ \Delta y \\ \Delta z \end{bmatrix}$ | Position errors in the platform frame [v] |
| $\begin{bmatrix} \phi_x \\ \phi_y \\ \phi_z \end{bmatrix}$ | Attitude errors in the platform frame [v] |
| $\begin{bmatrix} \Delta b_{xm} \\ \Delta b_{ym} \\ \Delta b_{zm} \end{bmatrix}$ | Accelerometer bias errors in the measurement frame [m] |
| $\begin{bmatrix} \Delta K_{xm} \\ \Delta K_{ym} \\ \Delta K_{zm} \end{bmatrix}$ | Accelerometer scale factor errors in the measurement frame [m] |
| $\begin{bmatrix} \Delta d_{xm} \\ \Delta d_{ym} \\ \Delta d_{zm} \end{bmatrix}$ | Gyro deviation errors in the measurement frame [m] |
| $\Delta\alpha$ | Mechanisation angle error in free azimuth |

The acquired measurements are speeds. The carrier is assumed to be perfectly immobile in translation and rotation. The sensor defaults are assumed to be constant over time.

| Accelerometers | gyrometers |
|---|---|
| $\frac{d}{dt}\begin{bmatrix} \Delta b_{xm} \\ \Delta b_{ym} \\ \Delta b_{zm} \end{bmatrix} = \begin{bmatrix} 0 \\ 0 \\ 0 \end{bmatrix} \quad \frac{d}{dt}\begin{bmatrix} \Delta K_{xm} \\ \Delta K_{ym} \\ \Delta K_{zm} \end{bmatrix} = \begin{bmatrix} 0 \\ 0 \\ 0 \end{bmatrix}$ | $\frac{d}{dt}\begin{bmatrix} \Delta d_{xm} \\ \Delta d_{ym} \\ \Delta d_{zm} \end{bmatrix} = \begin{bmatrix} 0 \\ 0 \\ 0 \end{bmatrix}$ |

These equations form a stationary system of form:

$$\frac{d}{dt}\begin{bmatrix}\Delta x\\\Delta y\\\Delta z\end{bmatrix}=\begin{bmatrix}\Delta V_x\\\Delta V_y\\\Delta V_z\end{bmatrix}$$

$$\frac{d}{dt}\begin{bmatrix}\Delta V_x\\\Delta V_y\\\Delta V_z\end{bmatrix}=T_{vm}\begin{bmatrix}-\Delta b_{xm}\\-\Delta b_{ym}\\-\Delta b_{zm}\end{bmatrix}+$$
$$T_{vm}\begin{bmatrix}-\Delta K_{xm}&0&0\\0&-\Delta K_{ym}&0\\0&0&-\Delta K_{zm}\end{bmatrix}T_{mv}\begin{bmatrix}0\\0\\g\end{bmatrix}-\begin{bmatrix}0&-g&0\\g&0&0\\0&0&0\end{bmatrix}\begin{bmatrix}\phi_x\\\phi_y\\\phi_z\end{bmatrix}+$$
$$\begin{bmatrix}0&-m_{21}&-m_{31}\\m_{21}&0&-m_{32}\\m_{31}&m_{32}&0\end{bmatrix}\begin{bmatrix}\Delta V_x\\\Delta V_y\\\Delta V_z\end{bmatrix}+\begin{bmatrix}0&0&0\\0&0&0\\p_{31}&p_{32}&p_{33}\end{bmatrix}\begin{bmatrix}\Delta x\\\Delta y\\\Delta z\end{bmatrix}+\begin{bmatrix}q_1\\q_2\\q_3\end{bmatrix}\Delta\alpha$$

$$\frac{d}{dt}\begin{bmatrix}\phi_x\\\phi_y\\\phi_z\end{bmatrix}=T_{vm}\begin{bmatrix}\Delta d_{xm}\\\Delta d_{ym}\\\Delta d_{zm}\end{bmatrix}+A\left(\begin{bmatrix}c_1\\c_2\\c_3\end{bmatrix}\right)\begin{bmatrix}\phi_x\\\phi_y\\\phi_z\end{bmatrix}+\begin{bmatrix}\frac{1}{\tau}\\-\frac{1}{R_x}\\0\end{bmatrix}\Delta V_x+\begin{bmatrix}\frac{1}{R_y}\\-\frac{1}{\tau}\end{bmatrix}\Delta V_y+\Omega_t\begin{bmatrix}a_1\\a_2\\a_3\end{bmatrix}\Delta x+\Omega_t\begin{bmatrix}b_1\\b_2\\b_3\end{bmatrix}\Delta y+\Omega_t\begin{bmatrix}-T_{vt}^{21}\\T_{vt}^{11}\\0\end{bmatrix}\Delta\alpha$$

The search method of non-observable vectors:
Searching for $$\begin{bmatrix}\begin{bmatrix}\Delta V_x\\\Delta V_y\\\Delta V_z\end{bmatrix},\begin{bmatrix}\Delta b_{xm}\\\Delta b_{ym}\\\Delta b_{zm}\end{bmatrix},\begin{bmatrix}\Delta K_{xm}\\\Delta K_{ym}\\\Delta K_{zm}\end{bmatrix},\begin{bmatrix}\Delta d_{xm}\\\Delta d_{ym}\\\Delta d_{zm}\end{bmatrix}\end{bmatrix}$$

such as:

$$\forall n\geq 0,\frac{d^n}{dt^n}\begin{bmatrix}\Delta V_x\\\Delta V_y\\\Delta V_z\end{bmatrix}=\begin{bmatrix}0\\0\\0\end{bmatrix}$$

The non-observable axes are the following:

| | Axis 1: $v_1$ | Axis 2: $v_2$ | Axis 3: $v_3$ | Axis 4: $v_4$ | Axis 5: $v_5$ |
|---|---|---|---|---|---|
| $\begin{bmatrix}\Delta x\\ \Delta y\\ \Delta z\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}1\\0\\0\end{bmatrix}$ |
| $\begin{bmatrix}\Delta V_x\\ \Delta V_y\\ \Delta V_z\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ |
| $\begin{bmatrix}\phi_x\\ \phi_y\\ \phi_z\end{bmatrix}$ | $\begin{bmatrix}1\\0\\0\end{bmatrix}$ | $\begin{bmatrix}0\\1\\0\end{bmatrix}$ | $\begin{bmatrix}0\\0\\1\end{bmatrix}$ | $\begin{bmatrix}0\\0\\0\end{bmatrix}$ | $\begin{bmatrix}0\\0\\0\end{bmatrix}$ |
| $\begin{bmatrix}\Delta b_{xm}\\ \Delta b_{ym}\\ \Delta b_{zm}\end{bmatrix}$ | $T_{mv}\begin{bmatrix}0\\-g\\0\end{bmatrix}$ | $T_{mv}\begin{bmatrix}g\\0\\0\end{bmatrix}$ | $\begin{bmatrix}0\\0\\0\end{bmatrix}$ | $\begin{bmatrix}0\\0\\-gT_{mv}^{33}\end{bmatrix}$ | $T_{mv}\begin{bmatrix}0\\0\\p_{31}\end{bmatrix}$ |
| $\begin{bmatrix}\Delta K_{xm}\\ \Delta K_{ym}\\ \Delta K_{zm}\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\1\end{bmatrix}$ | $\begin{bmatrix}0\\0\\0\end{bmatrix}$ |
| $\begin{bmatrix}\Delta d_{xm}\\ \Delta d_{ym}\\ \Delta d_{zm}\end{bmatrix}$ | $T_{mv}\begin{bmatrix}0\\-c_3\\c_2\end{bmatrix}$ | $T_{mv}\begin{bmatrix}c_3\\0\\-c_1\end{bmatrix}$ | $T_{mv}\begin{bmatrix}-c_2\\c_1\\0\end{bmatrix}$ | $\begin{bmatrix}0\\0\\0\end{bmatrix}$ | $T_{mv}\begin{bmatrix}-\Omega_t a_1\\-\Omega_t a_2\\-\Omega_t a_3\end{bmatrix}$ |
| $\Delta\alpha$ | 0 | 0 | 0 | 0 | 0 |

| | Axis 6: $v_6$ | Axis 7: $v_6$ | Axis 8: $v_8$ | Axis 9: $v_9$ | Axis 10: $v_{10}$ |
|---|---|---|---|---|---|
| $\begin{bmatrix}\Delta x\\ \Delta y\\ \Delta z\end{bmatrix}$ | $\begin{bmatrix}0\\1\\0\end{bmatrix}$ | $\begin{bmatrix}0\\0\\1\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ |
| $\begin{bmatrix}\Delta V_x\\ \Delta V_y\\ \Delta V_z\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ |
| $\begin{bmatrix}\phi_x\\ \phi_y\\ \phi_z\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ |
| $\begin{bmatrix}\Delta b_{xm}\\ \Delta b_{ym}\\ \Delta b_{zm}\end{bmatrix}$ | $T_{mv}\begin{bmatrix}0\\0\\p_{32}\end{bmatrix}$ | $T_{mv}\begin{bmatrix}0\\0\\p_{33}\end{bmatrix}$ | $\begin{bmatrix}-gT_{mv}^{13}\\0\\0\end{bmatrix}$ | $\begin{bmatrix}0\\-gT_{mv}^{23}\\0\end{bmatrix}$ | $\begin{bmatrix}0\\0\\0\end{bmatrix}$ |
| $\begin{bmatrix}\Delta K_{xm}\\ \Delta K_{ym}\\ \Delta K_{zm}\end{bmatrix}$ | $\begin{bmatrix}0\\0\\0\end{bmatrix}$ | $\begin{bmatrix}0\\0\\0\end{bmatrix}$ | $\begin{bmatrix}1\\0\\0\end{bmatrix}$ | $\begin{bmatrix}0\\1\\0\end{bmatrix}$ | $\begin{bmatrix}0\\0\\0\end{bmatrix}$ |
| $\begin{bmatrix}\Delta d_{xm}\\ \Delta d_{ym}\\ \Delta d_{zm}\end{bmatrix}$ | $T_{mv}\begin{bmatrix}-\Omega_t b_1\\-\Omega_t b_2\\-\Omega_t b_3\end{bmatrix}$ | $\begin{bmatrix}0\\0\\0\end{bmatrix}$ | $\begin{bmatrix}0\\0\\0\end{bmatrix}$ | $\begin{bmatrix}0\\0\\0\end{bmatrix}$ | $T_{mv}\begin{bmatrix}\Omega_t T_{vt}^{21}\\-\Omega_t T_{vt}^{11}\\0\end{bmatrix}$ |
| $\Delta\alpha$ | 0 | 0 | 0 | 0 | 1 |

Annex 3: Restriction of the Filter

Matrix differences are applied to the transition and observation matrices at each Kalman cycle as per a model of q non-observable axes $\hat{v}_{1,k}(\hat{X}_{H,k})$, $\hat{v}_{2,k}(\hat{X}_{H,k})$, ... $\hat{v}_{q,k}(\hat{X}_{H,k})$ obtained at each cycle k according to functions of the overall state $\hat{X}_{H,k}$ corresponding to the linearisation point of the observation matrix in the Kalman period.

$\phi_{k\to k+1}(\hat{X}_{\phi,k})$ is replaced by:

$\phi^*_{k\to k+1}(\hat{X}_{\phi,k}, \hat{X}_{H,k}, \hat{X}_{H,k+1})=\phi_{k\to k+1}(\hat{X}_{\phi,k})+\delta\phi_{k\to k+1}(\hat{X}_{\phi,k}, \hat{X}_{H,k}, \hat{X}_{H,k+1})$ close to $\phi_{k\to k+1}(\hat{X}_{\phi,k})$, and such as for i between 1 and q:

Equation 1: $\hat{v}_{i,k+1}(\hat{X}_{H,k+1})=\phi^*_{k\to k+1}(\hat{X}_{\phi,k},\hat{X}_{H,k},\hat{X}_{H,k+1})$, and $\|\delta\phi_{k\to k+1}(\hat{X}_{H,k},\hat{X}_{H,k+1})\|$ minimum visà-vis all possible solutions.

$H_k(\hat{X}_{H,k})$ is replaced by $H^*_k(\hat{X}_{H,k})+H_k(\hat{X}_{H,k})+\delta H_k(\hat{X}_{H,k})$ close to $H_k(\hat{X}_{H,k})$, and such as for i between 1 and q:

$^H k(^1 . H$

Equation 2: $H^*_k(\hat{X}_{H,k})\hat{c}_{i,k}(\hat{X}_{H,k})\|$ minimum relative to all possible solutions.

The matrix norm in question is the Froboenius norm.

The matrices $\phi^*_{k\to k+1}(\hat{X}_{\phi,k}, \hat{X}_{H,k},\hat{X}_{H,k+1})$ and $H_k^*(\hat{X}_{H,k})$ are used in the propagation step of the covariance matrix, and of the calculation of the Kalman gain.

The following notations will be adopted from now on:
$\phi^*_{k\to k+1}(\hat{X}_{\phi,k},\hat{X}_{H,k},\hat{X}_{k\to k+1})$ is noted $\phi_{k\to k+1}{}^*$
$\delta\phi_{k\to k+1}(\hat{X}_{H,k},\hat{X}_{H,k+1})$ is noted $\delta\phi_{k\to k+1}$
$H^*_k(\hat{X}_{H,k})$ is noted $H^*_k$
$\delta H_k(\hat{X}_{H,k})$ is noted $\delta H_k$ Resolution of equations 1 and 2 in the event where the modelled non-observable vectors $\hat{v}_{1,k}, \hat{v}_{2,k}, \ldots \hat{v}_{q,k}$ are orthogonal to each other at any time k:

The total matrix difference of the transition matrix corresponds to the sum of q independent matrix differences. The same applies for the matrix difference of the observation matrix.

$$\delta\phi_{k-1\to k} = \sum_{i=1}^{q} \delta\phi_{i,k-1\to k}$$

$$\delta H_k = \sum_{i=1}^{q} \delta H_{i,k}$$

And, for i between 1 and q:

$$\delta\phi_{i,k-1\to k} = \frac{1}{\hat{v}_{i,k-1}^T \hat{v}_{i,k-1}}(\hat{v}_{i,k/k-1} - \phi_{k-1\to k}\hat{v}_{i,k-1})\hat{v}_{i,k-1}^T$$

$$\delta H_{i,k} = -\frac{1}{\hat{v}_{i,k}^T \hat{v}_{i,k}}(H_k \hat{v}_{i,k})\hat{v}_{i,k}^T$$

The demonstration of these relationships is given in annex 8 according to a geometric method.

Resolution of equations 1 and 2 for a non-orthogonal base, and for any q:

This base defines a model of the non-observable vectorial space: any linear combination of the base vectors is non-observable.

The image by the observation matrix adjusted by any linear combination of these vectors is therefore zero. It is therefore possible to orthogonalise the base, then apply the preceding method to calculate the matrix difference of the observation matrix.

On the other hand, the image by the adjusted transition matrix of a linear combination of non-observable vectors corresponds to this same linear combination applied to the images by the same transition matrix of each one of the non-observable starting vectors. It is therefore possible to determine the linear combination for orthogonalising the base of non-observable vectors to the cycle k−1, and to use this same combination to transform the model of non-observable base at the cycle k. This applies the preceding method for calculating the matrix difference of the transition matrix.

Annex 4: Weighted Metrics

Scalars $m_\phi$ and $m_H$ called "metrics" accompany the calculated adjustment matrices and gave an indication on the relative amplitude of the adjustment, the aim being to modify the transition and observation matrices as little as possible.

Different methods are possible to compare $\|\delta\phi_{k-1\to k}\|$ to $\|\phi_{k-1\to k}\|$, and $\|\delta H_k\|$ to $\|H_k\|$. The aim is to have function increasing by $$\frac{\|\delta\phi_{k-1\to k}\|}{\phi_{k-1\to k}} \text{ and}$$

$$\frac{\|\delta H_k\|}{\|H_k\|},$$

or elementary consituents $$\frac{\|\delta\phi_{i,k-1\to k}\|}{\phi_{k-1\to k}} \text{ and}$$

$$\frac{\|\delta H_{i,k}\|}{\|H_k\|},$$

these norms being able to be calculated in the same way as that of a vector by grouping all the coefficients of the matrix in a single column.

Examples are given below:

$$m_\phi = \frac{\|\delta\phi_{k-1\to k}\|}{\|\phi_{k-1\to k}\|} \text{ or } m_\phi = \left(\frac{\|\delta\phi_{k-1\to k}\|}{\|\phi_{k-1\to k}\|}\right)^2 \text{ or } m_\phi = \sum_{i=1}^{N} \frac{\|\delta\phi_{i,k-1\to k}\|}{\|\phi_{k-1\to k}\|}$$

$$m_H = \frac{\|\delta H_k\|}{\|H_k\|} \text{ or } m_H = \left(\frac{\|\delta H_k\|}{\|H_k\|}\right)^2 \text{ or } m_H = \sum_{i=1}^{N} \frac{\|\delta H_{i,k}\|}{\|H_k\|}$$

Variants are possible using weighting functions and to balance the weight of the different components in the calculation of matrix norms. The same examples as the preceding can be reprised given these functions.

For example:

$$m_\phi = \frac{\|g_\phi(\delta\phi_{k-1\to k})\|}{\|g_\phi(\phi_{k-1\to k})\|} \text{ and}$$

$$m_H = \frac{\|g_H(\delta H_k)\|}{\|g_H(H_k)\|}$$

A possible realisation of these weighting functions consists of first constructing a weighting function f of a state vector, then deducing $g_\phi$ and $g_H$.

So by this method, associated with the vector $U=[u_1\ u_2 \ldots u_L]^T$ by a weighting function f is a vector $U=f(U)=[a_1\ a_2 \ldots a_L]U=[a_1u_1\ a_2u_2 \ldots a_Lu_L]^T$ where the real coefficients $a_1, a_2, \ldots a_L$ form the weighting coefficients. The latter weigh the transition matrix as follows:

$$g_\phi\left(\begin{bmatrix} t_{11} & t_{12} & \cdots & t_{1L} \\ t_{21} & t_{22} & & t_{2L} \\ \cdots & & \cdots & \\ t_{L1} & t_{L2} & & t_{LL} \end{bmatrix}\right) = \begin{bmatrix} \frac{a_1}{a_1}t_{11} & \frac{a_1}{a_2}t_{12} & \cdots & \frac{a_1}{a_N}t_{1L} \\ \frac{a_2}{a_1}t_{21} & \frac{a_2}{a_2}t_{22} & & \frac{a_2}{a_N}t_{2L} \\ \cdots & & \cdots & \\ \frac{a_L}{a_1}t_{L1} & \frac{a_L}{a_2}t_{L2} & & \frac{a_L}{a_L}t_{LL} \end{bmatrix}$$

Because if $V=\phi U$ then $f(V)=g_\phi(\phi)f(U)$ and vice versa. These are 2 equivalent ways of writing the relationship between U and V, the second calculating norms in a balanced way.

In fact, by placing $$\phi = \begin{bmatrix} t_{11} & t_{12} & \cdots & t_{1L} \\ t_{21} & t_{22} & & t_{2L} \\ \cdots & & \cdots & \\ t_{L1} & t_{L2} & & t_{LL} \end{bmatrix},$$

$U=[u_1\ u_2 \ldots u_L]^T$ and $V=[v_1\ v_2 \ldots v_L]^T$

This gives $$g_\phi(\phi)f(U) = \begin{bmatrix} \frac{a_1}{a_1}t_{11} & \frac{a_1}{a_2}t_{12} & \cdots & \frac{a_1}{a_L}t_{1L} \\ \frac{a_2}{a_1}t_{21} & \frac{a_2}{a_2}t_{22} & & \frac{a_2}{a_L}t_{2L} \\ \cdots & & \cdots & \\ \frac{a_L}{a_1}t_{L1} & \frac{a_L}{a_2}t_{L2} & & \frac{a_L}{a_L}t_{LL} \end{bmatrix} \begin{bmatrix} a_1 u_1 \\ a_2 u_2 \\ \cdots \\ a_L u_L \end{bmatrix} =$$

$$\begin{bmatrix} a_1 t_{11} & a_1 t_{12} & \cdots & a_1 t_{1L} \\ a_2 t_{21} & a_2 t_{22} & & a_2 t_{2L} \\ \cdots & & \cdots & \\ a_L t_{L1} & a_L t_{L2} & & a_L t_{LL} \end{bmatrix} \begin{bmatrix} u_1 \\ u_2 \\ \cdots \\ u_L \end{bmatrix}$$

That is $$g_\phi(\phi)f(U) =$$

$$[a_1 \ a_2 \ \cdots \ a_L] \begin{bmatrix} t_{11} & t_{12} & \cdots & t_{1L} \\ t_{21} & t_{22} & & t_{2L} \\ \cdots & & \cdots & \\ t_{L1} & t_{L2} & & t_{LL} \end{bmatrix} \begin{bmatrix} u_1 \\ u_2 \\ \cdots \\ u_L \end{bmatrix} = [a_1 \ a_2 \ \cdots \ a_L]\phi U$$

Therefore $g_\phi(\phi)f(U)=[a_1 a_2 \ldots a_L]^V$
Therefore $f = g_0(0 \ f(U)$ $$\text{Similarly } g_H\left(\begin{bmatrix} t_{11} & t_{12} & \cdots & t_{1L} \\ t_{21} & t_{22} & & t_{2L} \\ \cdots & & \cdots & \end{bmatrix}\right) = \begin{bmatrix} \frac{1}{a_1}t_{11} & \frac{1}{a_2}t_{12} & \cdots & \frac{1}{a_L}t_{1L} \\ \frac{1}{a_1}t_{21} & \frac{1}{a_2}t_{22} & & \frac{1}{a_L}t_{2L} \\ \cdots & & \cdots & \end{bmatrix}$$

Annex 5: Notion of Dynamic System and Application to Navigation

This is a determinist system of equations comprising an evolution equation and an observation equation. The evolution equation describes a state vector as a function of its former state and a command. The observation equation provides a scalar or vector dependent on the state vector. These equations can be non-linear. There are systems having continuous time and systems having discrete time.

$$\text{Continuous time system:} \begin{cases} \dot{X}(t) = f(X(t), u(t)) \\ z(t) = h(X(t)) \end{cases}$$

$$\text{Discrete time system:} \begin{cases} x_{k+1} = f(x_k, u_k) \\ z_k = h(x_k) \end{cases}$$

Where $X(t)$ and $x_k$ designate the state of the system, $u(t)$ and $u_k$ designate an input command, $z(t)$ and $z_k$ designate observation at a continuous instant t or discrete instant k, according to the continuous or discrete mode of representation.

The equations of the classic Newton mechanics describe the state of a mobile marker as a function of its acceleration and its angular speed at any time. These equations constitute an example of continuous evolution function, the state vector combining information on position, speed, and orientation of the mobile marker, and the command vector comprising acceleration and angular speed.

In the prior art of an inertial navigation unit calculations can be made discretely only. The result is that this continuous evolution function is modelled in the form of a discrete evolution function. Different known methods convert the continuous evolution equations into discrete evolution equations.

The observation function modelled in the dynamic system having discrete time of the inertial unit describes measurements taken by a particular non-inertial sensor. Several observation functions can be conducted successively over time as a function of sensors used.

The dynamic system having time discrete used in the navigation unit inertial is therefore a model as faithful as possible of another dynamic system, having continuous time, corresponding to the true world. The observability properties of these two systems are therefore different.

The observability properties of a dynamic system characterise the information on the state of the system at any given instant, which can be obtained by taking into account observations made later and evolution and observation functions. These properties depend especially on the command, that is, movements of the carrier in the case of the inertial navigation unit.

Annex 6: Observability of a System Having Continuous Time

Consider a dynamic non-linear continuous system, which at the instant 0 is in a state $X(0)$. Hereinbelow the propagation function and the input command channel the system into states $X(t)$, defining a particular trajectory in the state space.

As this trajectory is known, it can be assumed that the state initial now differs from $X(O)$ by a minor value $\delta X(0)$ called linearised state, and that the input commands are the same as in the preceding situation. The following states are $X(t)+\delta X(t)$ At each step the observation function collects information on the current state. The problem here is knowing if this information from start to finish of the relevant scenario know $\delta X(0)$. The space of the states linearised at the instant 0 is composed by an observable sub-space and a non-observable sub-space. The non-observable space at the instant 0 characterised by the state $\delta X(0)$ can be deduced as per a novel system dynamic for describing the linearised states by knowing the trajectory $X(t)$:

$$\begin{cases} \delta \dot{X}(t) = \frac{\partial f}{\partial X}(X(t), u(t)) \ \delta X(t) = F(X(t), u(t))\delta X(t) \\ \delta z(t) = \left(\frac{dh}{dX}\right)_{X(t)} \quad \delta X(t) = H(X(t))\delta X(t) \end{cases}$$

where F and H are matrices variable over time corresponding to the evolution matrix and the observation matrix of the system dynamic linearised for a given trajectory.

The non-observable space comprises linearised states $\delta X(t)$ such as $$\frac{d^k z(t)}{dt^k} = 0$$

for k=1,2,3, ... and t<0

The solutions form a vectorial space of linearised states. There is a base $B(0)$ of this space forming non-observable vectors $B(0)=(\delta X_1(0), \delta X_2(0), \ldots \delta X_4(0))$ at the instant 0.

Annex 7: Observability of a System with Discrete Time

Consider a discrete non-linear dynamic system, which at the instant 0 is in a state $X_0$. At different discrete successive instants, the propagation function and the input command channel the system in states $X_1, X_2, \ldots$ Knowing these successive states, it is assumed that the initial state now differs from $X_0$ by a minor value $\delta X_0$ called linearised state, and that the input commands are the same as in the preceding situation. The following successive states are $X_1+\delta X_1$, $X_2+\delta X_2, \ldots$ At each step the observation function collects information on the current state. The problem is how to ascertain whether or not this information, from the scenario in question's start to finish, makes it possible to know $\delta X_0$. The space of linearised states at the instant 0 is composed of an observable sub-space and a non-observable sub-space. An observer operating on the principle of linearisation, such as the EKF, could never estimate an error in the non-observable space of linearised states.

The non-observable space at the instant 0 characterised by the state $X_0$ can be deduced by considering the dynamic system of the linearised states $\delta X_k$, carrying out the evolution function and the observation function linearised at the different states $X_0, X_1, X_2, \ldots$ The evolution function linearised at the instant k is called "transition matrix" noted $\phi_{k \to k+1}$. The observation function linearised at the instant k is noted $H_k(X_k)$.

A first observation of the difference $\delta X_0$ about $X_0$ is made by means of the observation matrix $H_0(X_0)$ corresponding to the observation function linearised in $X_0$. A prediction of the difference $\delta X_1$ about $X_1$ is made from the difference $\delta X_0$ about $X_0$ by means of the transition matrix $\phi_{0 \to 1}(X_0)$ corresponding to the evolution function linearised in $X_0$. A second observation of the difference $ox_1$ about $_x$ is made by means of the observation matrix $H_1(X_1)$, etc . . .

It is known that the non-observable space of the system describing the perturbation is the kernel of the matrix:

$$M(X_0) = \begin{bmatrix} H_0(X_0) \\ H_1(X_1)\phi_{0 \to 1}(X_0) \\ H_2(X_2)\phi_{1 \to 2}(X_1)\phi_{0 \to 1}(X_0) \\ \ldots \end{bmatrix}$$

The non-observable space and the observable space therefore depend on the initial reference state $X_0$, of the input command (inertial data in the case of inertial units), and evolution and observation functions.

It can be supposed that the vector $v_0(X_0)$ forms part of the kernel of $M(X_0)$.

$$\text{Proposing} \begin{cases} v_1(X_1) = \phi_{0 \to 1}(X_0)v_0(X_0) \\ v_2(X_2) = \phi_{1 \to 2}(X_1)v_1(X_1) \\ v_3(X_3) = \phi_{2 \to 3}(X_2)v_2(X_2) \\ \ldots \end{cases},$$

$$\text{gives:} \begin{cases} H_0(X_0)v_0(X_0) = 0 \\ H_1(X_1)v_1(X_1) = 0 \\ H_2(X_2)v_2(X_2) = 0 \\ \ldots \end{cases}$$

At a given time, an observability condition is formed for a non-observable direction by the system of equations:

$$\begin{cases} v_{k+1}(X_{k+1}) = \phi_{k \to k+1}(X_k)v_k(X_k) \\ H_{k+1}(X_{k+1})v_{k+1}(X_{k+1}) = 0 \end{cases}$$

Where $v_k(X_k)$ form a particular non-observable vector at a discrete instant k.

This condition applies any time and is linked to the trajectory $X_0, X_1, X_2, \ldots$ In the EKF, this trajectory is noised by the estimation errors. This noise tends to reduce the kernel of the observability matrix, and therefore reduce the dimension of the non-observable space.

Also the transition and observation functions are not linearised at the same point. The set $X_0, X_1, X_2, \ldots$ is replaced by a set $\hat{X}_{H,0}, \hat{X}_{\phi,1}, \hat{X}_{H,1}, \hat{X}_{\phi,2}, \hat{X}_{H,2}, \hat{X}_{\phi,3}, \ldots$ $$Et: \begin{cases} v_1(X_{H,1}) = \phi_{0 \to 1}(X_{\phi,0})v_0(X_{H,0}) \\ v_2(X_{H,2}) = \phi_{1 \to 2}(X_{\phi,1})v_1(X_{H,1}) \\ v_3(X_{H,3}) = \phi_{2 \to 3}(X_{\phi,2})v_2(X_{H,2}) \\ \ldots \end{cases},$$

$$\text{With:} \begin{cases} H_0(X_{H,0})v_0(X_{H,0}) = 0 \\ H_1(X_{H,1})v_1(X_{H,1}) = 0 \\ H_2(X_{H,2})v_2(X_{H,2}) = 0 \\ \ldots \end{cases}$$

The observability condition is written:

$$\begin{cases} v_{k+1}(\hat{X}_{H,k+1}) = \phi_{k \to k+1}(\hat{X}_{\phi,k})v_k(\hat{X}_{H,k}) \\ H_{k+1}(\hat{X}_{H,k+1})v_{k+1}(\hat{X}_{H,k+1}) = 0 \end{cases}$$

Annex 8: Demonstration of the Adjustment Formula of Matrices for an Orthogonal Base of Vectors Hypothesis: p matrices column $U_i$ such as:

$$\forall (i,j) \text{tqi} \neq j, U_i^T U_j = 0 \quad (1)$$

Let p matrices column be $V_i$ of the same dimension as the $U_i$.

Let the matrix be A.

Problem: The aim here is to find a matrix $\delta A$ having a minimum norm such that:

$$(A + \delta A)(U_1 U_2 \ldots U_q) = V_1 V_2 \ldots V_q)$$

The matrix $A+\delta A$ can be in the form of p matrices as lines in columns, and the vector $V_k$ in the form of q scalars in columns:

$$\begin{pmatrix} L_1 + \delta L_1 \\ L_2 + \delta L_2 \\ \ldots \\ L_p + \delta L_p \end{pmatrix} (U_1 \ U_2 \ \ldots \ U_q) = \begin{pmatrix} v_{11} & v_{12} & \ldots & v_{1q} \\ v_{21} & v_{22} & & v_{2q} \\ \ldots & \ldots & & \ldots \\ v_{q1} & v_{q2} & \ldots & v_{qq} \end{pmatrix}$$

The aim is therefore to find the $\delta L_k$ having a minimum norm such that:

$$\forall (k,l) \in \{1,2, \ldots q\}^2, (L_k + \delta L_k)U_l = v_{kl} \quad (2)$$

Geometric interpretation of the problem: The line and column matrices are associated with vectors in a vectorial space of dimension greater than q. The same notations are kept by adding an arrow above the variables.

The condition (1) leads to: $\forall (i,j) tqi \neq j, \vec{U}_i \perp \vec{U}_j$ The condition (2) leads to the following scalar product:

$$\forall (k,l) \in \{1,2,\ldots,q\}^{2^2}, (\vec{L}_k + \delta \vec{L}_k) \cdot \vec{U}_1 = v_{kl}$$

The projection of the vector $\vec{L}_k$ on the oriented axis defined by the unitary vector $$\frac{\vec{U}_1}{\|\vec{U}_1\|} \text{ has } \vec{L}_k \cdot \frac{\vec{U}_1}{\|\vec{U}_1\|} = \frac{\vec{L}_k \cdot \vec{U}_1}{\|\vec{U}_1\|}$$

for abscissa on this axis. This is the governing cosine of $\vec{L}_k$ according to this axis.

The aim here is $\delta \vec{L}_k$ such as the projection of $\vec{L}_k + \delta \vec{L}_k$ on this axis is $$\frac{(\vec{L}_k + \delta \vec{L}_k) \cdot \vec{U}_1}{\|\vec{U}_1\|} = \frac{v_{kl}}{\|\vec{U}_1\|}.$$

$\delta \vec{L}_k$ can be decomposed according to the vectors $U_i$, which generate a vectorial space of dimension q, and according to a residual component $\vec{\varepsilon}_k$ orthogonal to this space:

$$\delta \vec{L}_k = \Sigma_{l=1}^q \delta \vec{L}_{kl} + \vec{\varepsilon}_k$$

And therefore $$\frac{(\vec{L}_k + \delta \vec{L}_{k1}) \cdot \vec{U}_1}{\|\vec{U}_1\|} = \frac{v_{kl}}{\|\vec{U}_1\|}.$$

FIG. 7 shows that there is an infinite number of solutions $\vec{X}_{k1}$. The minimal solution corresponds to a vector $\delta \vec{L}_{k1}$ colinear to $\vec{U}_1$.

According to the figure this gives:

$$\delta \vec{L}_{k1} = \frac{v_{kl}}{\|\vec{U}_1\|} \frac{\vec{U}_1}{\|\vec{U}_1\|} - \frac{\vec{L}_k \cdot \vec{U}_1}{\|\vec{U}_1\|} \frac{\vec{U}_1}{\|\vec{U}_1\|}$$

$$\delta \vec{L}_{k1} = \left( \frac{v_{kl}}{\|\vec{U}_1\|} - \frac{\vec{L}_k \cdot \vec{U}_1}{\|\vec{U}_1\|} \right) \frac{\vec{U}_1}{\|\vec{U}_1\|}$$

$$\delta \vec{L}_{k1} = \frac{1}{\|\vec{U}_1\|^2} (v_{kl} - \vec{L}_k \cdot \vec{U}_1) \vec{U}_1$$

This therefore gives $\vec{\varepsilon}_k = \vec{0}$, and:

$$\delta \vec{L}_k = \sum_{l=1}^q \frac{1}{\|\vec{U}_1\|^2} (v_{kl} - \vec{L}_k \cdot \vec{U}_1) \vec{U}_1$$

Matrix notation therefore again gives:

$$\delta L_k = \sum_{l=1}^q \frac{1}{U_1^T U_1} (v_{kl} - L_k U_1) U_1^T$$

Reforming the matrices A and δA, after some manipulations, gives the relationship:

$$\boxed{\delta A = \sum_{l=1}^q \frac{1}{U_1^T U_1} (V_1 - A U_1) U_1^T}$$

The invention claimed is:

1. A method for estimating a navigation state of a mobile carrier using an extended Kalman filter, wherein the navigation state comprises variables, wherein the method comprises steps of:
    acquiring measurements of at least one of the variables,
    using the extended Kalman filter to produce a current estimation of the navigation state and a covariance matrix delimiting in a space of the navigation state a region of errors, from a previous estimation of the navigation state, an observation matrix, a transition matrix and acquired measurements,
    wherein the method further comprises adjusting the transition matrix and the observation matrix prior to their use by the extended Kalman filter, such that the adjusted matrices fulfill an observability condition, which depends on at least one of the variables of the state of the carrier, wherein the observability condition is adapted to prevent the Kalman filter from reducing the dimension of the region along at least one non-observable axis of the space, wherein the observability condition to be fulfilled by the adjusted transition and observation matrices is the nullity of the kernel of an observability matrix, which is associated with said matrices, and wherein adjusting the transition matrix and the observation matrix comprises:
    calculating at least one primary base of non-observable vectors from the previous estimation of the navigation state,
    for each matrix to be adjusted, calculating at least one matrix difference associated with the matrix from the primary base of vectors,
    for each matrix to be adjusted, offsetting the matrix to be adjusted according to the matrix difference the matrix is associated with, so as to fulfill the observability condition.

2. The method as claimed in claim 1, in which using the extended Kalman filter comprises:
    propagating the preceding estimated state into a predicted state using the adjusted transition matrix,
    linearising in the predicted state a non-linear model so as to produce the observation matrix prior to the adjustment step,
    adjusting the observation matrix produced by linearising.

3. The method as claimed in claim 1, also comprising orthogonalizing the primary base into a secondary base of vectors, wherein the matrix difference associated with the observation matrix is calculated from the secondary base of vectors.

4. The method as claimed in claim 1, in which the matrix difference associated with the observation matrix is a sum of elementary matrix differences, wherein each elementary matrix difference is calculated from a vector of the secondary base associated to the elementary matrix difference.

5. The method as claimed in claim 1 whereof the steps are repeated in successive cycles, and in which a current cycle comprises steps of:
   storing the secondary base of vectors and storing orthogonalization coefficients which are also produced from the primary base when orthogonalizing the primary base into the secondary base of vectors,
   transforming the primary base of vectors into a tertiary base of vectors using previous orthogonalization coefficients stored during a preceding cycle,
   wherein calculating the matrix difference associated with the transition matrix takes as input a secondary base stored during the preceding cycle and the tertiary base calculated during the current cycle.

6. The method as claimed in claim 5, wherein the matrix difference associated with the transition matrix is a sum of elementary matrix differences, wherein each elementary matrix difference is calculated from a vector of the secondary base stored during the preceding cycle and specific to the elementary matrix difference, and from a vector of the tertiary base calculated during the current cycle and specific to the elementary matrix difference.

7. An inertial unit comprising a plurality of sensors and at least one processor configured to estimate navigation state of the inertial unit by executing the method as claimed in claim 1.

8. A computer program product comprising program code instructions for execution of the steps of the process as claimed in claim 1, when this program is executed at least one processor.

* * * * *